(12) United States Patent
Akimoto

(10) Patent No.: US 6,870,872 B2
(45) Date of Patent: Mar. 22, 2005

(54) ETALON AND EXTERNAL RESONANCE TYPE LASER

(75) Inventor: Kazuaki Akimoto, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 32 days.

(21) Appl. No.: 10/268,954

(22) Filed: Oct. 11, 2002

(65) Prior Publication Data

US 2003/0142716 A1 Jul. 31, 2003

(30) Foreign Application Priority Data

Jan. 28, 2002 (JP) ........................................ 2002-018640

(51) Int. Cl.⁷ .............................................. H01S 3/08
(52) U.S. Cl. ...................................................... 372/92
(58) Field of Search ..................................... 372/92, 20

(56) References Cited

U.S. PATENT DOCUMENTS

| | | | | |
|---|---|---|---|---|
| 4,682,340 A | * | 7/1987 | Dave et al. | 372/108 |
| 4,935,932 A | * | 6/1990 | Johnson et al. | 372/33 |
| 5,091,912 A | * | 2/1992 | Bretenaker et al. | 372/23 |
| 5,469,279 A | * | 11/1995 | Sharp et al. | 349/74 |
| 5,684,623 A | * | 11/1997 | King et al. | 359/346 |
| 6,130,971 A | * | 10/2000 | Cao | 385/31 |
| 6,205,159 B1 | * | 3/2001 | Sesko et al. | 372/20 |
| 6,282,215 B1 | * | 8/2001 | Zorabedian et al. | 372/20 |
| 6,314,119 B1 | * | 11/2001 | Morton | 372/57 |
| 6,437,904 B1 | * | 8/2002 | Reeder | 359/322 |
| 2002/0080467 A1 | * | 6/2002 | Damask | 359/301 |

FOREIGN PATENT DOCUMENTS

JP          11-289118          10/1999

* cited by examiner

*Primary Examiner*—Don Wong
*Assistant Examiner*—Hung Tran Vy
(74) *Attorney, Agent, or Firm*—Staas & Halsey LLP

(57) ABSTRACT

An etalon includes an analyzer, a first $\lambda/4$ plate having an optical axis forming a 45 degree angle with respect to an optical axis of the analyzer and receiving a light transmitted via the analyzer, and a second $\lambda/4$ plate having an optical axis which is parallel to or 90 degrees to the optical axis of the first $\lambda/4$ plate and receiving a light transmitted via the first $\lambda/4$ plate. A reflection may occur between the first and second $\lambda/4$ plates.

10 Claims, 7 Drawing Sheets

US 6,870,872 B2

ETALON AND EXTERNAL RESONANCE TYPE LASER

BACKGROUND OF THE INVENTION

This application claims the benefit of a Japanese Patent Application No. 2002-018640 filed Jan. 28, 2002, in the Japanese Patent Office, the disclosure of which is hereby incorporated by reference.

1. Field of the Invention

The present invention generally relates to etalons and external resonance type lasers, and more particularly to an etalon which eliminates a need for a reflection mirror by making a reflected light which is obtained through multiple reflection have a wavelength selection characteristic, and to an external resonance type laser which has a simplified optical system by using such an etalon as a wavelength selection element.

2. Description of the Related Art

When forming an optical transmission system, it is in most cases necessary to use a wavelength selection element having a wavelength selection characteristic. Particularly in the case of a wavelength multiplexing optical transmission system, it is essential to use the wavelength selection element, and various elements based on various operating principles are used as the wavelength selection element. An etalon is one of such elements. The etalon forms two reflection surfaces, and utilizes the multiple reflection between the two reflection surfaces. The etalon is characterized by its simple structure and the capability of being set to have a wavelength selection characteristic in a wide range. But there are demands to further simplify the structure of the etalon and to enable an accurate wavelength selection characteristic to be obtained.

Due to the trend of the number of wavelengths to increase in the wavelength multiplexing optical transmission system, the need for a laser having an accurate oscillation wavelength is increasing, thereby resulting in the development of external resonance type lasers. There are demands to further simplify the structure and to stabilize the oscillation wavelength of the external resonance type lasers.

FIG. 1 is a diagram showing a basic structure of a conventional etalon.

As shown in FIG. 1, two reflection surfaces 1 and 2 having a certain reflectivity confront each other. A solid or gas having a light transmitting characteristic is disposed in a gap between the two reflection surfaces 1 and 2.

In a most typical case where a solid is disposed in the gap between the two reflection surfaces 1 and 2, the etalon is formed by two confronting boundary surfaces between the solid and external air.

On the other hand, in a most typical case where a gas is disposed in the gap between the two reflection surfaces 1 and 2, the gas is sealed within a box made of transparent plates made of glass or the like, and the etalon is formed by two confronting boundary surfaces between the gas and the transparent box (transparent plates).

In the conventional etalon, an incident light which is input to the first reflection surface 1 undergoes multiple reflection in the gap between the first and second reflection surfaces 1 and 2, and is output from the second reflection surface 2. A wavelength selection characteristic is realized by utilizing a light transmitted through the second reflection surface 2.

In general, the first and second reflection surfaces 1 and 2 of the etalon do not necessarily have to be parallel to each other, and it is sufficient as long as the first and second reflection surfaces 1 and 2 confront each other.

FIG. 2 is a diagram for explaining the operating principle of the conventional etalon.

In FIG. 2, the etalon is sectioned into three regions 11, 12 and 13 by the first and second reflection surfaces 1 and 2, so that the multiple reflection occurs between the first and second reflection surfaces 1 and 2. For the sake of convenience, it is assumed in FIG. 2 that the first and second reflection surfaces 1 and 2 are parallel to each other, and that the regions 11 and 13 are made of the same material.

In the following description, a wavelength of the incident light to the reflection surface 1 from the region 11 is denoted by $\lambda$, an amplitude of this incident light is denoted by $a_0$, an incident angle of the incident light to the reflection surface 1 is denoted by $\theta$, an angle of refraction at the region 12 is denoted by $\theta'$, a refractive index of the material forming the region 11 with respect to light is denoted by $n$, a refractive index of the material forming the region 12 with respect to light is denoted by $n'$, an intensity reflectivity at the first reflection surface 1 is denoted by $R_1$, an amplitude reflectivity when incident from the region 11 to the region 12 is denoted by $r_1$, an amplitude reflectivity when incident from the region 12 to the region 11 is denoted by $r_1'$, an amplitude transmittance from the region 11 to the region 12 is denoted by $t_1$, an amplitude transmittance from the region 12 to the region 11 is denoted by $t_1'$, an intensity reflectivity at the second reflection surface 2 is denoted by $R_2$, an amplitude reflectivity when incident from the region 13 to the region 12 is denoted by $r_2$, an amplitude reflectivity when incident from the region 12 to the region 13 is denoted by $r_2'$, an amplitude transmittance from the region 13 to the region 12 is denoted by $t_2$, an amplitude transmittance from the region 12 to the region 13 is denoted by $t_2'$, and a distance between the first and second reflection surfaces 1 and 2 is denoted by $h$. In addition, a phase error of adjacent lights transmitted or adjacent lights reflected as a result of the multiple reflection is denoted by $\delta$.

FIG. 3 is a diagram for explaining the phase error $\delta$ between the adjacent transmitted lights or reflected lights.

A portion of the incident light to the first reflection surface 1 at the incident angle $\theta$ is reflected by a reflection angle $\theta$ at an incident point Q and becomes $L_{R1}$. Another portion of the incident light is transmitted to the region 12 at a refraction angle $\theta'$ and a portion of the transmitted light is reflected at a point R on the second reflection surface 2 with a reflection angle $\theta'$. Another portion of the transmitted light is transmitted to the region 13 at a refraction angle $\theta$ and becomes $L_{T1}$.

In addition, the light reflected by the second reflection surface 2 reaches a point S on the first reflection surface 1. A portion of the light reaching the point S is transmitted to the region 11 with a refraction angle $\theta$ and becomes $L_{R2}$, and another portion of the light reaching the point S is reflected by a reflection angle $\theta'$ and reaches a point T on the second reflection surface 2. A portion of the light reaching the point T is transmitted to the region 13 with a refraction angle $\theta$ and becomes $L_{T2}$.

If an intersection of a normal to the reflected light $L_{R1}$ from the point S is denoted by U, and a normal to the transmitted light $L_{T1}$ from the point T is denoted by V, a difference in the distances of $L_{R1}$ and $L_{R2}$ can be obtained by subtracting the length of a line QU from a sum of the lengths of the lines QR and RS. In addition, a difference in the distances of $L_{T1}$ and $L_{T2}$ can be obtained by subtracting the length of a line RV from a sum of the lengths of the lines RS and ST. When the analysis is made based on the precondition that the first and second reflection surfaces 1 and 2 are parallel to each other, the following formula (1) stands, although a description on the calculation details will be omitted.

$$\lambda = (4\pi n' h \cdot \cos\theta')/\lambda \quad (1)$$

If an amplitude of the transmitted light from the second reflection surface 2 is denoted by $a_t$, the following formula (2) stands, where $i=\sqrt{(-1)}$.

$$a_t = a_0 t_1 t_2' + a_0 t_1 t_2'(r_1' r_2')\exp(i\delta) + \\ a_0 t_1 t_2'(r_1' r_2')^2 \exp(i\delta)^2 + \\ a_0 t_1 t_2'(r_1' r_2')^3 \exp(i\delta)^3 + \quad (2)$$

As may be seen from the formula (2) above, at is a geometric series of the first term $a_0 t_1 t_2'$ and a ratio $(r_1' r_2')\exp(i\delta)$. Hence, the following formula (3) can be obtained from a sum of the series.

$$a_t = a_0 t_1 t_2'/\{1-(r_1' r_2')\exp(i\delta)\} \quad (3)$$

Accordingly, an intensity transmittance T of the etalon can be obtained from the following formula (4).

$$T = (t_1 t_2')^2 / \{1-(r_1' r_2')^2 + 4 r_1' r_2' \sin^2(\delta/2)\} \quad (4)$$

From the law of refraction, the relationships of the following formulas (5) and (6) stand.

$$n \sin\theta = n' \sin\theta' \quad (5)$$

$$t_1 t_1' = 1 - r_1^2, \, r_1' = -r_1, \, R_1 = r_1^2 \\ t_2 t_2' = 1 - r_2^2, \, r_2' = -r_2, \, R_2 = r_2^2 \quad (6)$$

Therefore, by setting $R_1 = R_2 = R$ based on the precondition that the regions 11 and 13 are made of the same material, the relationships $(t_1 t_2')^2 = (1-R)^2$, $(1-r_1' r_2')^2 = (1-R)^2$, and $r_1' r_2' = R$ stand.

Accordingly, an intensity transmittance $T_E$ of the etalon can be obtained from the following formula (7).

$$T_E = 1/\{1 + 4R \sin^2(\delta/2)/(1-R)^2\} \quad (7)$$

FIG. 4 is a diagram showing an example of the intensity transmittance of the conventional etalon for a case where n=1.5, h=1 mm), $\theta$=0 (degrees) and R=0.9. In other words, this intensity transmittance has peaks at approximately 0.8 nm intervals in the narrow wavelength region, and the wavelength selection characteristic of the etalon can be confirmed.

FIG. 5 is a diagram showing a structure of a conventional external resonance type laser.

The external resonance type laser shown in FIG. 5 includes a laser medium 4, a collimator lens 5 for forming a light emitted from the laser medium 4 into a parallel light, a wavelength selection element 6, and a reflection mirror 7. The wavelength selection element 6 feeds back the light having a specific wavelength to the laser medium 4, depending on an incident angle of the light received from the collimator lens 5 and an incident angle of the light reflected from the reflection mirror 7. In FIG. 5, L0 denotes an oscillation light having the specific wavelength.

Normally, a diffraction grating is used as the wavelength selection element 6.

As shown in FIG. 4, it is possible to confirm the wavelength selection characteristic of the transmitted light from the conventional etalon. However, in order to obtain the transmitted light having the wavelength selection characteristic at the light incident side of the etalon, the conventional etalon must be additionally provided with a reflection mirror.

FIG. 6 is a diagram showing an optical system which obtains a light having the wavelength selection characteristic using reflection.

The optical system shown in FIG. 6 includes an etalon 21, a lens 22, and a reflection mirror 23. Of the light incident to the left side of the etalon 21 in FIG. 6, the light portion which undergoes multiple reflection in the etalon 21 is transmitted to the right side of the etalon 21. The transmitted light portion from the right side of the etalon 21 is converged by the lens 22 and is reflected by the reflection mirror 23. The reflected light portion from the reflection mirror 23 is again converged by the lens 22 and is incident to the right side of the etalon 21 so as to be output from the right side of the etalon 21.

Therefore, the light portion which is incident to the right side of the etalon 21, undergoes the multiple reflection in the etalon 21, and is transmitted to the right side of the etalon 21, has the wavelength selection characteristic described above. Hence, when this transmitted light portion from the right side of the etalon 21 is converged by the lens 23, reflected by the reflection mirror 23, again converged by the lens 23, and incident to the right side of the etalon 21, the transmitted light obtained from the left side of the etalon 21 also has the wavelength selection characteristic. Hence, it is possible to obtain the light having the wavelength selection characteristic at the light incident side of the etalon 21 by employing the structure shown in FIG. 6.

However, when reflecting the light transmitted through the etalon 21 by the reflection mirror 23 so as to output the transmitted light from the light incident side of the etalon 21, the reflection mirror 23 cannot make contiguous contact with the etalon 21. This is because the transmitted light having the wavelength selection characteristic cannot be obtained if the reflection mirror 23 were arranged to make contiguous contact with the etalon 21.

Consequently, new problems occur because of the need to arrange the reflection mirror 23 and the etalon 21 separate from each other.

A first problem is that a second etalon which is different from the etalon 21 is formed between the reflection surface at the transmitting side of the etalon 21 and the reflection surface of the reflection mirror 23, if the reflection surface at the transmitting side of the etalon 21 and the reflection surface of the reflection mirror 23 are arranged parallel to each other. In this case, a composite etalon will be formed by the etalon 21 and the second etalon, and the combined wavelength selection characteristic becomes different from the wavelength selection characteristic obtained solely by the etalon 21.

In order to eliminate this first problem, it is necessary to set an angle $\alpha$ formed by the reflection surface at the transmitting side of the etalon 21 and the reflection surface of the reflection mirror 23 to a non-zero value. In addition, in order not to change the wavelength selection characteristic of the light transmitted through the etalon 21 and obtained at the left side of the etalon 21 in FIG. 6, the light converged by the lens 22 must be incident perpendicularly to the reflection surface of the reflection mirror 23. This means that the incident angle $\theta$ of the light to the etalon 21 is non-zero, and that the refraction angle $\theta'$ within the etalon 21 is non-zero.

In the formula (1) described above, δ determines the wavelength selection characteristic of the etalon 21. Accordingly, the following formula (8) can be obtained by differentiating the formula (1) by θ'.

$$\partial\delta/\partial\theta' = -4\pi n'h \sin\theta'/\lambda \quad (8)$$

Since the angle θ' is normally in a range of 0 to 90 degrees, the formula (8) indicates that the larger the angle θ', the larger the change in the corresponding δ. Accordingly, the stability of the wavelength selection characteristic of the transmitted light from the etalon 21 deteriorates as the angle θ' becomes larger.

In other words, the following problems (A) and (B) occur according to the optical system having the structure shown in FIG. 6.

(A) The angle α must be non-zero in order to prevent formation of the composite etalon, thereby causing the structure of the optical system to become complicated.

(B) The light incident angle to the etalon 21 must be non-zero in order to maintain the wavelength selection characteristic of the etalon 21, thereby causing the stability of the wavelength selection characteristic to deteriorate.

The above described problems (A) and (B) are generated due to the combination of the etalon and the reflection mirror. For this reason, it is conceivable to use the reflected light of the etalon itself, but this in turn would cause a second problem.

An intensity reflectivity $R_E$ of the reflected light of the etalon itself has a relationship with the intensity transmittance $T_E$ described by the following formula (9).

$$R_\epsilon = 1 - T_E \quad (9)$$

FIG. 7 is a diagram showing an example of the intensity reflectivity of the conventional etalon for a case where n=1.5, h=1 (mm), θ=0 (degrees) and R=0.9. In other words, this intensity reflectivity has valleys at approximately 0.8 nm intervals in the narrow wavelength region, but the reflected light is output with a high reflectivity at virtually all wavelength regions, and the wavelength selection characteristic cannot be obtained.

In other words, if the reflection mirror is not used and the reflected light of the etalon itself is used, it is impossible to obtain the light having the wavelength selection characteristic.

The external resonance type laser having the structure shown in FIG. 5 uses the diffraction grating as the wavelength selection element 6. The light reflected by the diffraction grating is reflected by the reflection mirror 7 and returned to the diffraction grating, so as to feed back the light having the specific wavelength to the laser medium 4 and cause oscillation at the specific wavelength. Hence, the optical system of the external resonance type laser which uses the diffraction grating as the wavelength selection element 6 cannot be formed linearly, that is, elements forming the laser cannot be arranged linearly, and there is a problem in that the structure of the optical system becomes complicated.

In addition, if the etalon using the reflection mirror as shown in FIG. 6 is used as the wavelength selection element, the optical system can be made slightly more linear than the external resonance type laser shown in FIG. 5, but it is still impossible to considerably simplify the structure of the optical system.

SUMMARY OF THE INVENTION

Accordingly, it is a general object of the present invention to provide a novel and useful etalon and external resonance type laser, in which the problems described above are eliminated.

Another and more specific object of the present invention is to provide an etalon which can obtain a reflected light through multiple reflection and having a wavelength selection characteristic without requiring a reflection mirror, and an external resonance type laser which can use such an etalon as a wavelength selection element.

Still another object of the present invention is to provide an etalon comprising an analyzer; a first λ/4 plate, having an optical axis forming a 45 degree angle with respect to an optical axis of the analyzer, and receiving a light transmitted via the analyzer; and a second λ/4 plate, having an optical axis which is parallel to or 90 degrees to the optical axis of the first λ/4 plate, and receiving a light transmitted via the first λ/4 plate, such that a reflection occurs between the first and second λ/4 plates.

A further object of the present invention is to provide an etalon comprising an analyzer; a first λ/4 plate, having an optical axis forming a 45 degree angle with respect to an optical axis of the analyzer, and receiving a light transmitted via the analyzer; and a second λ/4 plate, having an optical axis which is parallel to or 90 degrees to the optical axis of the first λ/4 plate, and receiving a light transmitted via the first λ/4 plate, where the analyzer receives as an incident light to the etalon a linearly polarized light parallel to the optical axis of the analyzer.

Another object of the present invention is to provide an etalon comprising a polarization splitting layer or prism; a first λ/4 plate, having an optical axis forming a 45 degree angle with respect to an optical axis of the polarization splitting layer or prism, and receiving a light transmitted via the polarization splitting layer or prism; and a second λ/4 plate, having an optical axis which is parallel to or 90 degrees to the optical axis of the first λ/4 plate, and receiving a light transmitted via the first λ/4 plate, such that a reflection occurs between the first and second λ/4 plates.

Still another object of the present invention is to provide an etalon comprising a polarization splitting layer or prism; a first λ/4 plate, having an optical axis forming a 45 degree angle with respect to an optical axis of the polarization splitting layer or prism, and receiving a light transmitted via the polarization splitting layer or prism; and a second λ/4 plate, having an optical axis which is parallel to or 90 degrees to the optical axis of the first λ/4 plate, and receiving a light transmitted via the first λ/4 plate, where the polarization splitting layer or prism receives as an incident light to the etalon a linearly polarized light parallel to the optical axis of the polarization splitting layer or prism.

A further object of the present invention is to provide an external resonance type laser comprising a laser medium having first and second semi-transparent mirrors; and an etalon comprising an element selected from a group consisting of an analyzer, a polarization splitting layer and a polarization splitting prism, a first λ/4 plate, having an optical axis forming a 45 degree angle with respect to an optical axis of the element, and receiving a light transmitted via the element, and a second λ/4 plate, having an optical axis which is parallel to or 90 degrees to the optical axis of the first λ/4 plate, and receiving a light transmitted via the first λ/4 plate, such that a reflection occurs between the first and second λ/4 plates, where a light transmitted via the first semi-transparent mirror being incident to the etalon, a light output from a light incident side of the etalon is fed back to the laser medium, and the laser medium outputs an output light of the external resonance type laser via the second semi-transparent mirror.

Another object of the present invention is to provide an external resonance type laser comprising a laser medium having first and second semi-transparent mirrors; and an etalon comprising an element selected from a group consisting of an analyzer, a polarization splitting layer and a polarization splitting prism, a first λ/4 plate, having an optical axis forming a 45 degree angle with respect to an optical axis of the element, and receiving a light transmitted via the element; and a second λ/4 plate, having an optical axis which is parallel to or 90 degrees to the optical axis of the first λ/4 plate, and receiving a light transmitted via the first λ/4 plate, where the element receives as an incident light to the etalon a linearly polarized light parallel to the optical axis of the element, a light transmitted via the first semi-transparent mirror is incident to the etalon, a light output from a light incident side of the etalon is fed back to the laser medium, and the laser medium outputs an output light of the external resonance type laser via the second semi-transparent mirror.

Other objects and further features of the present invention will be apparent from the following detailed description when read in conjunction with the accompanying drawings.

DESCRIPTION OF THE PREFERRED EMBODIMENTS

A description will be given of embodiments of an etalon according to the present invention and an external resonance type laser according to the present invention, by referring to FIG. 8 and the subsequent drawings.

Figure 8:
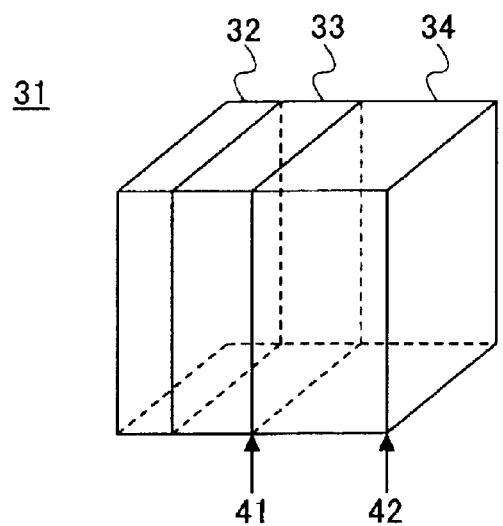
FIG. 8 is a perspective view showing an embodiment of an etalon according to the present invention.
Figure 9:
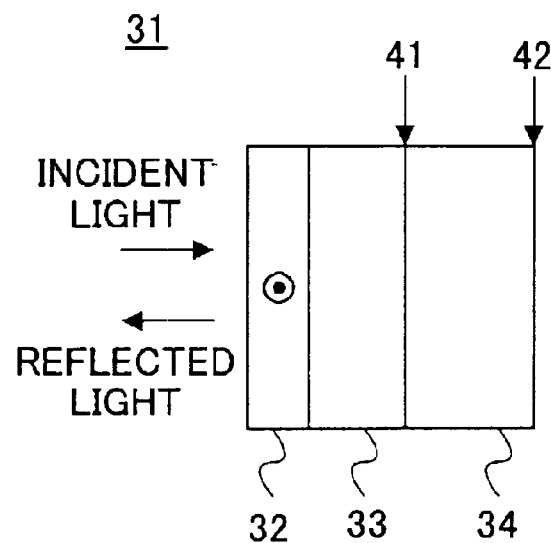
FIG. 9 is a plan view showing the embodiment of the etalon shown in FIG. 8.

FIG. 8 is a perspective view showing an embodiment of the etalon according to the present invention, and FIG. 9 is a plan view showing the embodiment of the etalon shown in FIG. 8. Further, FIG. 10 is a diagram showing optical axes of a λ/4 plate and an analyzer.

As shown in FIGS. 8 and 9, an etalon 31 includes an analyzer 32, a first λ/4 plate 33, and a second λ/4 plate 34. A first reflection surface 41 is formed at a boundary between the first and second λ/4 plates 33 and 34, and a second reflection surface 42 is formed at a surface of the second λ/4 plate 34 on the opposite side of the surface of the second λ/4 plate 34 located at the boundary between the first and second λ/4 plates 33 and 34.

An incident light to the etalon 31 is input to the analyzer 32 as shown in FIG. 9, and multiple reflection occurs within the second λ/4 plate 34, between the first and second reflection surfaces 41 and 42. Unwanted reflected light is absorbed by the analyzer 32 and the first λ/4 plate 33. A reflected light having a wavelength selection characteristic is output from the analyzer 32 as shown in FIG. 9.

Figure 10:
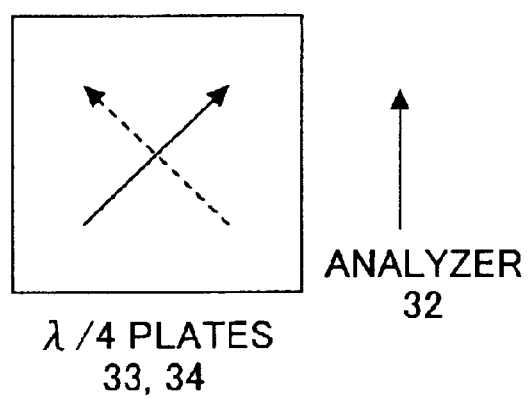
FIG. 10 is a diagram showing optical axes of a λ/4 plate and an analyzer.

The relationship of the optical axes of the analyzer 32, the first λ/4 plate 33 and the second λ/4 plate 34 is as shown in FIG. 10. If the optical axis of the analyzer 32 is on the paper surface in FIG. 10 (or parallel to the paper surface in FIG. 10) and is perpendicular to a horizontal line (not shown) on the paper surface, the optical axes of the first and second λ/4 plates 33 and 34 are ±45 degrees to the optical axis of the analyzer 32. In other words, if the optical axis of the analyzer 32 is taken as a reference, the optical axis of the first λ/4 plate 33 forms 45 degrees with respect to the optical axis of the analyzer 32, and the optical axis of the second λ/4 plate 34 is parallel to or forms 90 degrees with respect to the optical axis of the first λ/4 plate 33.

If the optical axis of the analyzer 32 is perpendicular to the paper surface in FIG. 9, when viewed from the top in the plan view shown in FIG. 9, the optical axes of the first and second λ/4 plates 33 and 34 are ±45 degrees to the paper surface in FIG. 9.

Figure 11:
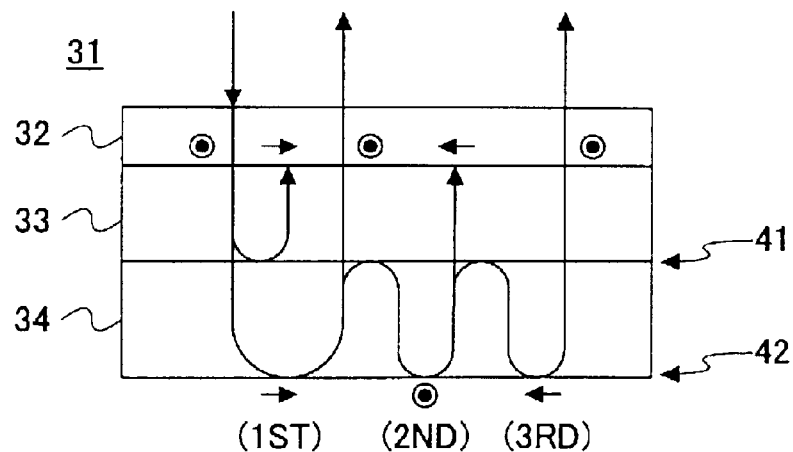
FIG. 11 is a diagram for explaining the operating principle of the etalon according to the present invention.

FIG. 11 is a diagram for explaining the operating principle of the etalon according to the present invention. In FIG. 11, those parts which are the same as those corresponding parts in FIGS. 8 and 9 are designated by the same reference numerals, and a description thereof will be omitted.

In FIG. 11, the confronting surfaces of the first and second λ/4 plates 33 and 34 make contiguous contact so as to form the first reflection surface 41. The surface of the second λ/4 plate 34, on the opposite side of the surface making contact with the first λ/4 plate 33, forms the second reflection surface 42.

Accordingly, the refractive indexes of the first and second λ/4 plates 33 and 34 with respect to light need to be different, and the refractive index of the second λ/4 plate 34 and the refractive index of the surrounding medium need to be different, in order to form the first and second reflection surfaces 41 and 42. However, such relationships of the refractive indexes can easily be achieved, because crystals, rutile, liquid crystals and the like may be used for the first and second λ/4 plates 33 and 34.

Alternatively, in a case where the refractive indexes of the first and second λ/4 plates 33 and 34 with respect to light are the same, a semi-transparent mirror may be formed at a boundary surface between the first and second λ/4 plates 33 and 34, so that a reflection occurs at the boundary surface between the first and second λ/4 plates 33 and 34. Hence, this is equivalent to making the refractive indexes of the first and second λ/4 plates 33 and 34 mutually different.

In either case, the reflection occurs at the boundary surface between the first and second λ/4 plates 33 and 34. In other words, the second λ/4 plate 34 makes a reflection occur between the second λ/4 plate 34 and the first λ/4 plate 33.

The operating principle of the etalon 31 will now be described, by assuming for the sake of convenience that the optical axis of the analyzer 32 is perpendicular to the paper surface in FIG. 11 and a polarization direction (or optical axis) of the incident light to the etalon 31 is also perpendicular to the paper surface in FIG. 11.

Since the optical axis of the analyzer 32 and the polarization direction (or optical axis) of the incident light to the etalon 31 are parallel to each other, the incident light is transmitted through the analyzer 32, and becomes incident to the first λ/4 plate 33 via the boundary surface between the analyzer 32 and the first λ/4 plate 33.

A portion of the light incident to the first λ/4 plate 33 is reflected by the boundary surface between the first and second λ/4 plates 33 and 34, and is returned to the boundary surface between the first λ/4 plate 33 and the analyzer 32. Since the incident light is assumed to be a linearly polarized light, a circularly polarized light is obtained at the boundary surface between the first and second λ/4 plates 33 and 34. After the light portion is reflected by the boundary surface between the first and second λ/4 plates 33 and 34 and reaches the boundary surface between the first λ/4 plate 33 and the analyzer 32, the light portion reaching the boundary surface between the first λ/4 plate 33 and the analyzer 32 is a linearly polarized light which is perpendicular to the incident light. Accordingly, the polarization direction of the light portion which is reflected by the boundary surface between the first and second λ/4 plates 33 and 34 and reaches the boundary surface between the first λ/4 plate 33 and the analyzer 32 is perpendicular to the optical axis of the analyzer 32, and this light portion is absorbed within the analyzer 32, thereby making it impossible for this light portion to return to the light incident side of the analyzer 32 (that is, the light incident side of the etalon 31).

On the other hand, a portion of the light incident to the first λ/4 plate 33 is transmitted into the second λ/4 plate 34 via the boundary surface (first reflection surface 41) between the first and second λ/4 plates 33 and 34. This light portion transmitted into the second λ/4 plate 34 makes a first reflection at the surface (second reflection surface 42) thereof opposite to the boundary surface between the first and second λ/4 plates 33 and 34, and returns to the boundary surface between the first and second λ/4 plates 33 and 34. Of the light portion returning to the boundary surface between the first and second λ/4 plates 33 and 34, a portion is transmitted into the first λ/4 plate 33 and reaches the boundary surface between the first λ/4 plate 33 and the analyzer 32. When making the first reflection, the light portion becomes a linearly polarized light which is perpendicular to the incident light. When returning to the boundary surface between the first and second λ/4 plates 33 and 34 after the first reflection, the light portion becomes a circularly polarized light. In addition, when returning to the boundary surface between the first λ/4 plate 33 and the analyzer 32 after the first reflection, the light portion becomes a linearly polarized light which is parallel to the incident light. Hence, the light portion returning to the boundary surface between the first λ/4 plate 33 and the analyzer 32 after the first reflection is transmitted through the analyzer 32 and is output to the light incident side of the analyzer 32, as the output reflected light of the etalon 31.

Moreover, of the light portion returning to the boundary surface between the first and second λ/4 plates 33 and 34 after the first reflection, a portion is reflected by the boundary surface between the first and second λ/4 plates 33 and 34, and makes a second reflection at the surface (second reflection surface 42) of the second λ/4 plate opposite to the boundary surface between the first and second λ/4 plates 33 and 34. Of the light portion returning to the boundary surface between the first and second λ/4 plates 33 and 34 after the second reflection, a portion is transmitted into the first λ/4 plate 33 and reaches the boundary surface between the first λ/4 plate 33 and the analyzer 32. When making the second reflection, the light portion becomes a linearly polarized light which is parallel to the incident light. When returning to the boundary surface between the first and second λ/4 plates 33 and 34 after the second reflection, the light portion becomes a circularly polarized light. In addition, when returning to the boundary surface between the first λ/4 plate 33 and the analyzer 32 after the second reflection, the light portion becomes a linearly polarized light which is perpendicular to the incident light. Hence, the light portion returning to the boundary surface between the first λ/4 plate 33 and the analyzer 32 after the second reflection is absorbed with in the analyzer 32, thereby making it impossible for this light portion to return to the light incident side of the analyzer 32 (that is, the light incident side of the etalon 31).

Furthermore, of the light portion returning to the boundary surface between the first and second λ/4 plates 33 and 34 after the second reflection, a portion is reflected by the boundary surface between the first and second λ/4 plates 33 and 34, and makes a third reflection at the surface (second reflection surface 42) of the second λ/4 plate opposite to the boundary surface between the first and second λ/4 plates 33 and 34. Of the light portion returning to the boundary surface between the first and second λ/4 plates 33 and 34 after the second reflection, a portion is transmitted into the first λ/4 plate 33 and reaches the boundary surface between the first λ/4 plate 33 and the analyzer 32. When making the third reflection, the light portion becomes a linearly polarized light which is perpendicular to the incident light. When returning to the boundary surface between the first and second λ/4 plates 33 and 34 after the third reflection, the light portion becomes a circularly polarized light. In addition, when returning to the boundary surface between the first λ/4 plate 33 and the analyzer 32 after the third reflection, the light portion becomes a linearly polarized light which is parallel to the incident light. Thus, the light portion returning to the boundary surface between the first λ/4 plate 33 and the analyzer 32 after the third reflection is transmitted through the analyzer 32 and is output to the light incident side of the analyzer 32, as the output reflected light of the etalon 31.

Thereafter, polarization conversions similar to those described above occur every time the light is reflected within the etalon 32. In other words, of the light portions reflected by the surface (second reflection surface 42) of the second λ/4 plate 34 opposite to the boundary surface between the first and second λ/4 plates 33 and 34, the light portion reaching the boundary surface between the first λ/4 plate 33 and the analyzer 32 after an odd-numbered (any of first, third, fifth, ... ) reflection is transmitted through the analyzer 32 and is output to the light incident side of the analyzer 32 as the output reflected light of the etalon 31, while the light portion reaching the boundary surface between the first λ/4 plate 33 and the analyzer 32 after an even-numbered (any of second, fourth, sixth, ... ) reflection is absorbed within the analyzer 32 and will not reach the light incident side of the analyzer 32.

For the sake of convenience, the incident light is illustrated in FIG. 11 as being perpendicular to the light incident side (surface) of the etalon 31, and the reflected light is illustrated at a position different from that of the incident light. However, in a case where the incident light is perpendicular to the light incident side of the etalon 31, the reflected light propagates in a reverse direction in the same path as the incident light. Of course, it is not essential for the incident light to be perpendicular to the light incident side of the etalon 31, and the incident angle of the incident light with respect to the light incident side of the etalon 31 may be an arbitrary angle other than zero, as long as the thicknesses and refractive indexes of the first and second λ/4 plates 33 and 34 are set so that the light propagates a distance amounting to λ/4 within the first and second λ/4 plates 33 and 34.

In the description given heretofore, it is a precondition that a reflection does not occur at the boundary surface between the analyzer 32 and the first λ/4 plate 33. This is because, various combinations of the materials used for the analyzer 32 and the first λ/4 plate 33 are possible, and it is possible to set the refractive indexes of the analyzer 32 and the first λ/4 plate 33 to become approximately the same.

In a case where it is impossible to set the refractive indexes of the analyzer 32 and the first λ/4 plate 33 to become approximately the same, it is necessary to make an optical adjustment at the boundary surface between the analyzer 32 and the first λ/4 plate 33. In such a case, a λ/4 adjusting (or matching) layer (not shown) may be interposed between the analyzer 32 and the first λ/4 plate 33, where the λ/4 adjusting (or matching) layer is made of a material having a refractive index equal to a square root of a product of the refractive index of the analyzer 32 and the refractive index of the first λ/4 plate 33. Unwanted reflection at the boundary of the analyzer 32 and the first λ/4 plate 33 can be prevented by providing this λ/4 adjusting (or matching) layer at the interface, thereby making it possible to accurately obtain the desired wavelength selection characteristic of the etalon 31.

As described above, the light portion which undergoes the odd-numbered reflection at the second reflection surface 42 of the second λ/4 plate 34 in FIG. 11 and reaches the boundary surface between the first λ/4 plate 33 and the analyzer 32, is output to the light incident side of the analyzer 32 and output as reflected light from the etalon 31. When analyzing the intensity reflectivity of this reflected light from the etalon 31, it may be seen that this reflected light is made up of only the even-numbered terms of the formula (2) described above. Hence, the intensity reflectivity $R_E$ of this reflected light can be described by the following formula (10).

$$R_e = (1-R_1)^2 R_2 / \{(1-R_1 R_2)^2 + 4 R_1 R_2 \sin^2 \delta\} \quad (10)$$

Figure 1:
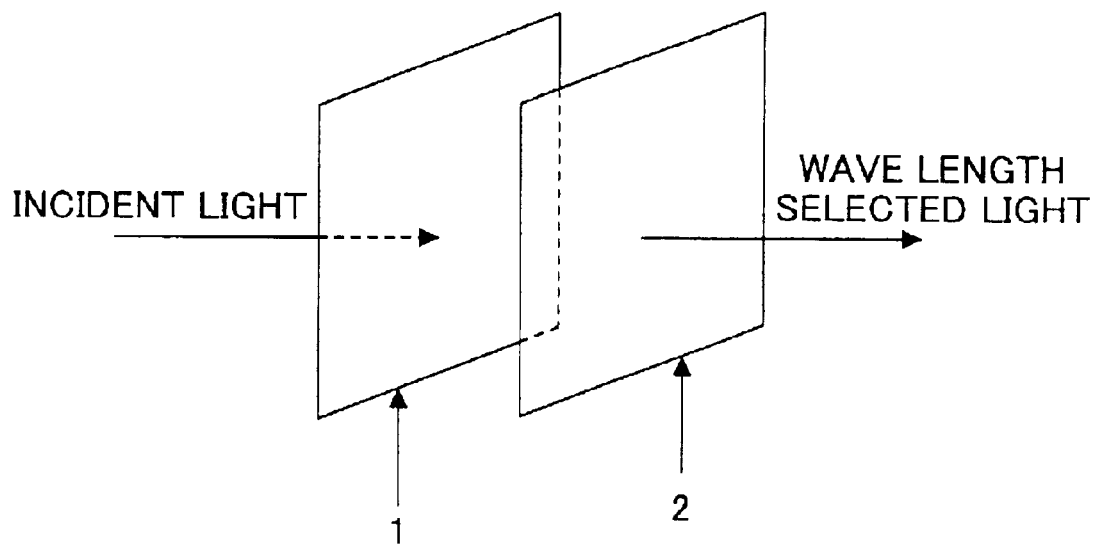
FIG. 1 is a diagram showing a basic structure of a conventional etalon.
Figure 2:
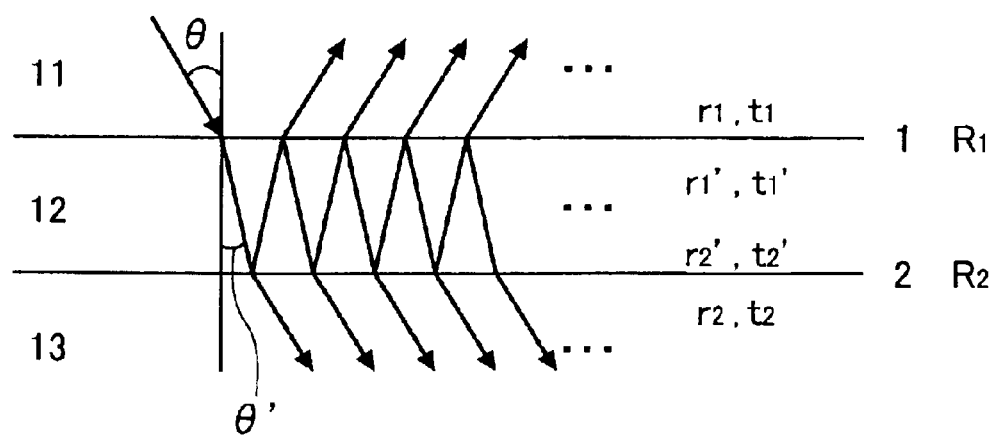
FIG. 2 is a diagram for explaining the operating principle of the conventional etalon.
Figure 3:
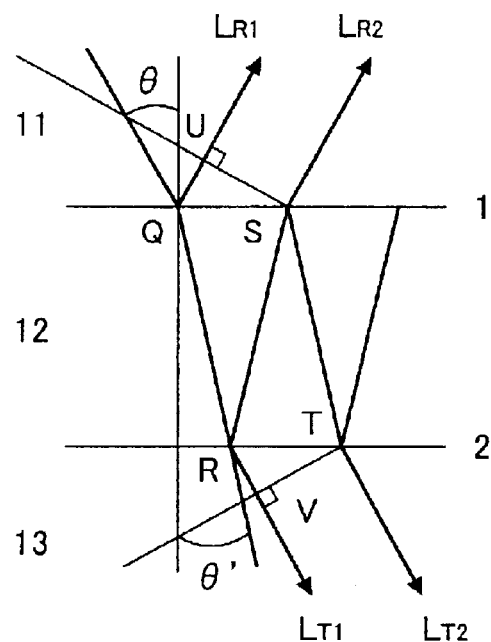
FIG. 3 is a diagram for explaining a phase error between the adjacent transmitted lights or reflected lights.
Figure 4:
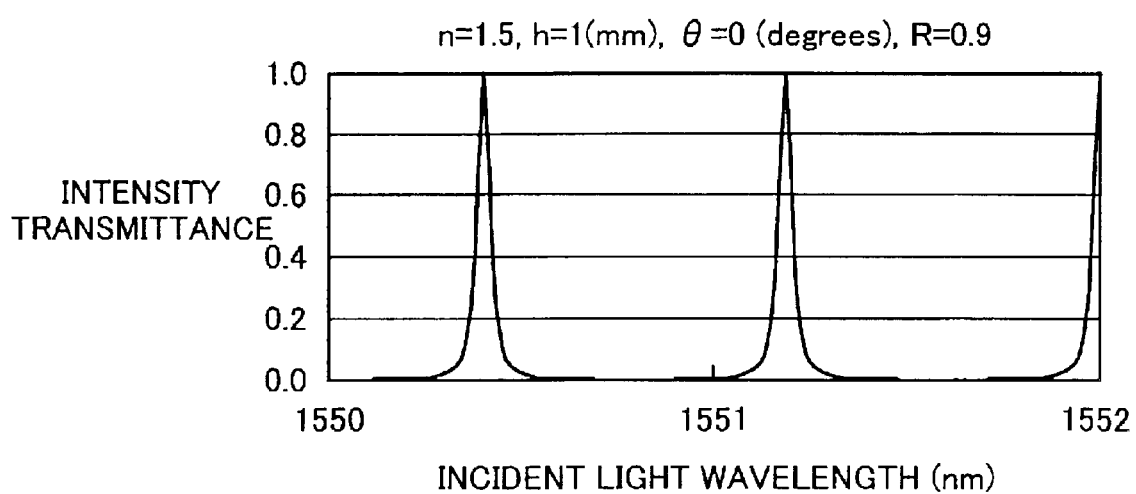
FIG. 4 is a diagram showing an example of the intensity transmittance of the conventional etalon.
Figure 5:
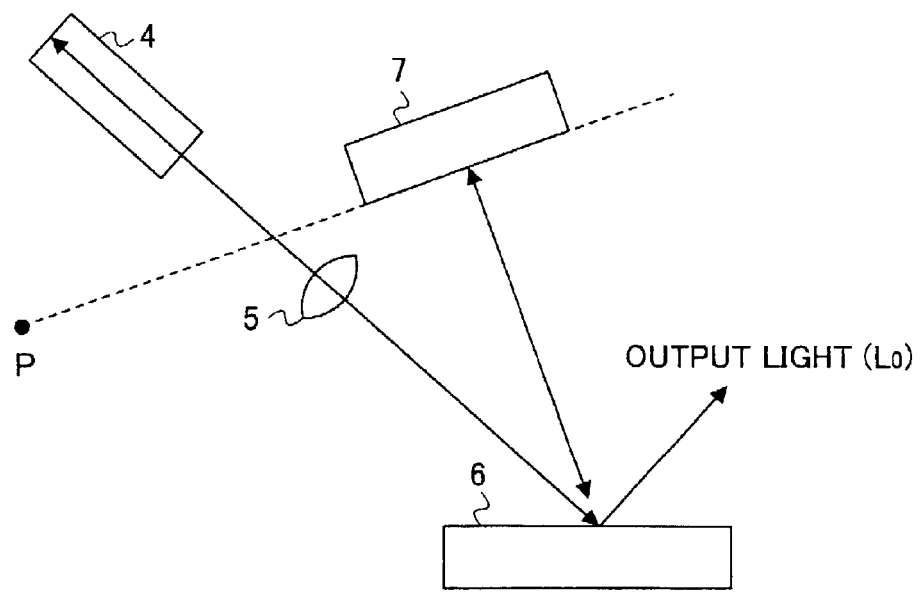
FIG. 5 is a diagram showing a structure of a conventional external resonance type laser.
Figure 6:
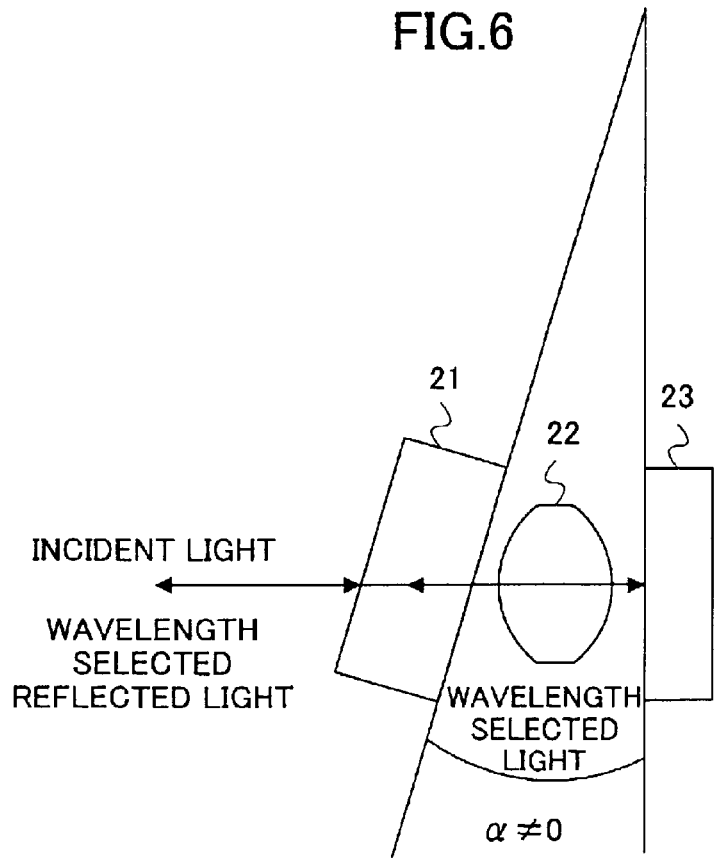
FIG. 6 is a diagram showing an optical system which obtains a light having a wavelength selection characteristic using reflection.
Figure 7:
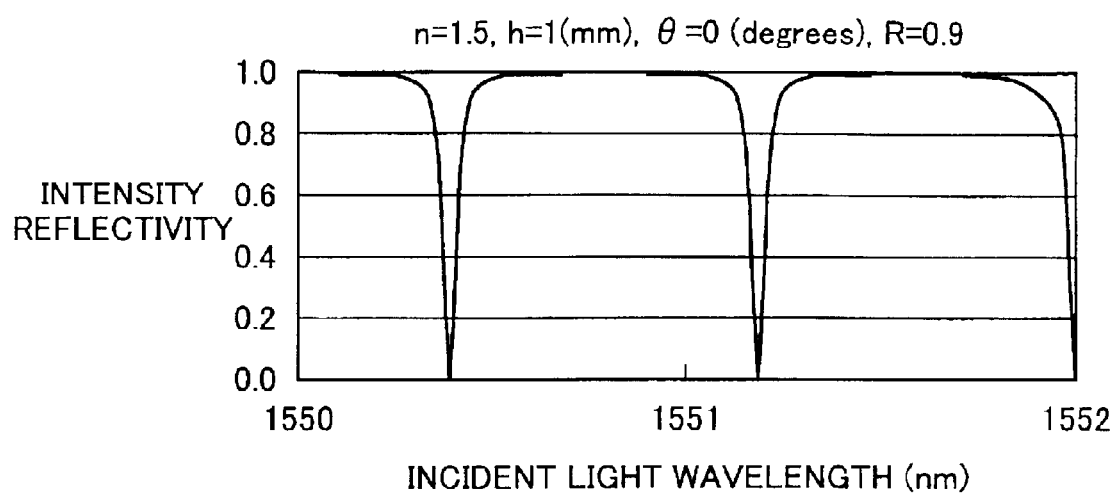
FIG. 7 is a diagram showing an example of the intensity reflectivity of the conventional etalon.
Figure 12:
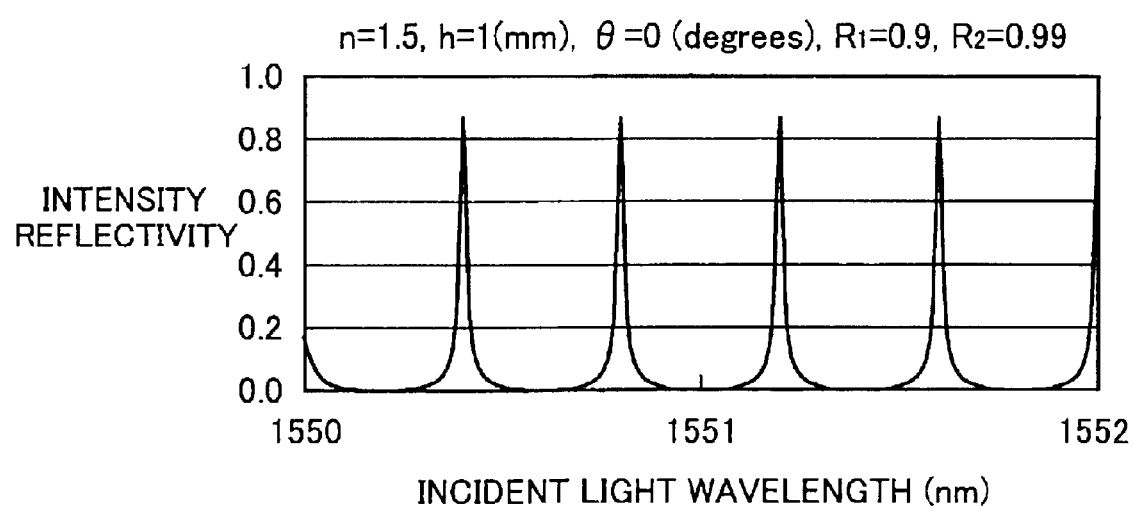
FIG. 12 is a diagram showing an intensity reflectivity of the etalon according to the present invention.

FIG. 12 is a diagram showing an intensity reflectivity of the etalon 31 according to the present invention for a case where n=1.5, h=1 (mm), θ=0 (degrees), $R_1$=0.9 and $R_2$=0.99. As may be seen from FIG. 12, a wavelength selection characteristic can be observed in the intensity reflectivity of the etalon 31. In addition, compared to the intensity transmittance of the conventional etalon shown in FIG. 4, a free spectrum range (FSR) is 1/2 in the case of the intensity reflectivity of the etalon 31 according to the present invention shown in FIG. 12.

In the case shown in FIG. 12, the peak of the intensity reflectivity is 0.8 or greater, but the peak of the intensity reflectivity can be increased by setting $R_1 < R_2$.

In the above described embodiment, crystals, rutile, liquid crystals and the like are used for the first and second λ/4 plates 33 and 34. However, the first and second λ/4 plates 33 and 34 may be realized by materials having the Farady effect.

Although the illustration of graphs will be omitted, it is possible to vary the reflection characteristic of the etalon according to the present invention, by electrically or magnetically controlling the refractive index of birefringence crystals, liquid crystals, and materials having the Farady effect.

Furthermore, it is possible to use a polarization splitting layer or a polarization splitting prism in place of the analyzer 32. In this case, it is also possible to form the etalon according to the present invention, in which, of the light portions reflected by the surface (second reflection surface 42) of the second λ/4 plate 34 opposite to the boundary surface between the first and second λ/4 plates 33 and 34, the light portion reaching the boundary surface between the first λ/4 plate 33 and the polarization splitting layer or prism after an odd-numbered (any of first, third, fifth, . . . ) reflection is transmitted through the polarization splitting layer or prism and is output to the light incident side of the analyzer 32 as the output reflected light of the etalon 31, while the light portion reaching the boundary surface between the first λ/4 plate 33 and the polarization splitting layer or prism after an even-numbered (any of second, fourth, sixth, . . . ) reflection is absorbed within the polarization splitting layer or prism and will not reach the light incident side of the polarization splitting layer or prism.

Figure 13:
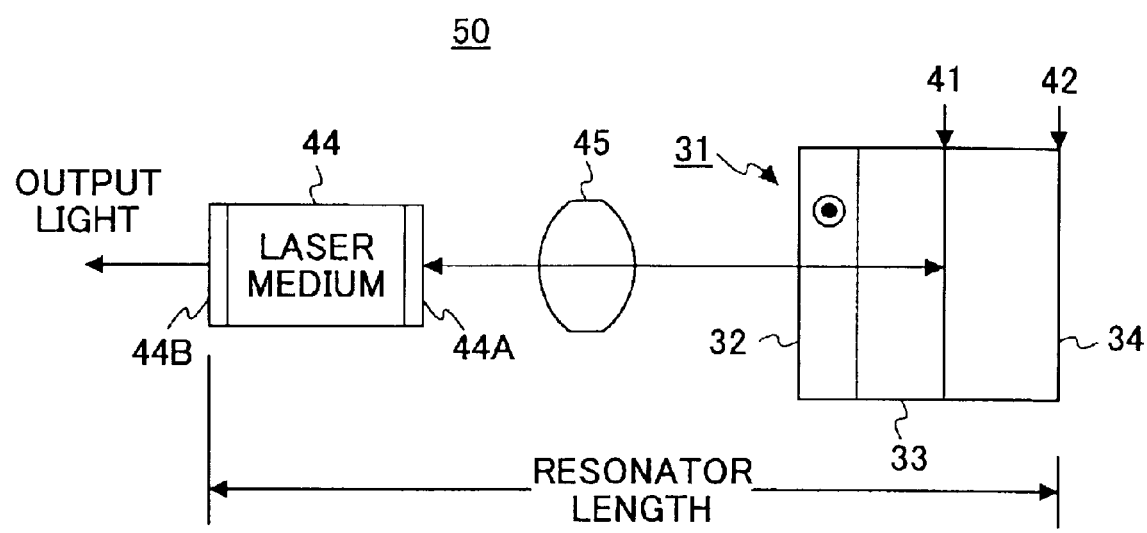
FIG. 13 is a diagram showing an embodiment of an external resonance type laser according to the present invention.

Next, a description will be given of an embodiment of the external resonance type layer according to the present invention, which uses the etalon according to the present invention, by referring to FIG. 13. FIG. 13 is a diagram showing this embodiment of the external resonance type laser according to the present invention. In FIG. 13, those part which are the same as those corresponding parts in FIG. 11 are designated by the same reference numerals, and a description thereof will be omitted.

An external resonance type laser 50 shown in FIG. 13 includes a laser medium 44, a collimator lens 45, and the etalon 31. For the sake of convenience, it is also assumed in this embodiment that the refractive indexes of the first and second λ/4 plates 33 and 34 of the etalon 31 are mutually different, and no semi-transparent mirror is interposed between the first and second λ/4 plates 33 and 34.

Because the etalon 31 has the wavelength selection characteristic described above, only a portion of the light emitted via a first semi-transparent mirror 44A disposed on a side of the laser medium 44 closer to the etalon 31 having a specific wavelength is fed back to the laser medium 4, and an oscillation light having the specific wavelength can be obtained from a second semi-transparent mirror 44B disposed on a side of the laser medium 44 opposite from the etalon 31.

By electrically or magnetically controlling the refractive indexes of the materials forming the first and second λ/4 plates 33 and 34, it is possible to variably control the oscillation wavelength of the external resonance type laser 50.

Further, the present invention is not limited to these embodiments, but various variations and modifications may be made without departing from the scope of the present invention.

What is claimed is:

1. An etalon comprising:
   an analyzer configured to receive light;
   a first λ/4 plate, having an optical axis forming a 45 degree angle with respect to an optical axis of the analyzer, and configured to receive light transmitted via the analyzer;
   a second λ/4 plate, having an optical axis which is parallel to or 90 degrees to the optical axis of the first λ/4 plate, configured to receive light transmitted via the first λ/4 plate;

a first reflection surface at a boundary between the first and second λ/4 plates; and a second reflection surface at a surface of the second λ/4 plate on an opposite side of a surface of the second λ/4 plate located at the boundary between the first and second λ/4 plates, wherein a reflection occurs between the first and second reflection surfaces.

2. The etalon as claimed in claim 1, wherein said first and second λ/4 plates are respectively made of a material selected from a group consisting of birefringence crystals, liquid crystals, and materials having Farady effect.

3. The etalon as claimed in claim 2, wherein refractive indexes of the materials forming said first and second λ/4 plates are electrically or magnetically controlled.

4. An etalon comprising:

an analyzer configured to receive light;

a first λ/4 plate, having an optical axis forming a 45 degree angle with respect to an optical axis of the analyzer, and configured to receive light transmitted via the analyzer;

a second λ/4 plate, having an optical axis which is parallel to or 90 degrees to the optical axis of the first λ/4 plate and configured to receive light transmitted via the first λ/4 plate;

a first reflection surface at a boundary between the first and second λ/4 plates; and a second reflection surface at a surface of the second λ/4 plate on an opposite side of a surface of the second λ/4 plate located at the boundary between the first and second λ/4 plates, wherein a reflection occurs between the first and second reflection surfaces, and said analyzer receive, as an incident light to the etalon, a linearly polarized light parallel to the optical axis of the analyzer.

5. The etalon as claimed in claim 4, wherein said first and second λ/4 plates are respectively made of a material selected from a group consisting of birefringence crystals, liquid crystals, and materials having Farady effect.

6. The etalon as claimed in claim 5, wherein refractive indexes of the materials forming said first and second λ/4 plates are electrically or magnetically controlled.

7. An etalon comprising:

a polarization splitting layer or prism, configured to receive light;

a first λ/4 plate, having an optical axis forming a 45 degree angle with respect to an optical axis of the polarization splitting layer or prism, and receiving a light transmitted via the polarization splitting layer or prism;

a second λ/4 plate, having an optical axis which is parallel to or 90 degrees to the optical axis of the first λ/4 plate, configured to receive a light transmitted via the first λ/4 plate;

a first reflection surface at a boundary between the first and second λ/4 plates; and a second reflection surface at a surface of the second λ/4 plate on an opposite side of a surface of the second λ/4 plate located at the boundary between the first and second λ/4 plates, wherein a reflection occurs between the first and second reflection surfaces.

8. An etalon comprising:

a polarization splitting layer or prism, configured to receive light;

a first λ/4 plate, having an optical axis forming a 45 degree angle with respect to an optical axis of the polarization splitting layer or prism, and configured to receive light transmitted via the polarization splitting layer or prism;

a second λ/4 plate, having an optical axis which is parallel to or 90 degrees to the optical axis of the first λ/4 plate, and configured to receive light transmitted via the first λ/4 plate, a first reflection surface at a boundary between the first and second λ/4 plates; and a second reflection surface at a surface of the second λ/4 plate on an opposite side of a surface of the second λ/4 plate located at the boundary between the first and second λ/4 plates, wherein a reflection occurs between the first and second reflection surfaces, and said polarization splitting layer or prism receives as an incident light to the etalon a linearly polarized light parallel to the optical axis of the polarization splitting layer or prism.

9. An external resonance type laser, comprising:

a laser medium having first and second semi-transparent mirrors; and an etalon comprising:

an element selected from a group consisting of an analyzer, a polarization splitting layer and a polarization splitting prism, configured to receive light, a first λ/4 plate, having an optical axis forming a 45 degree angle with respect to an optical axis of the element, and configured to receive light transmitted via the element;

a second λ/4 plate, having an optical axis which is parallel to or 90 degrees to the optical axis of the first λ/4 plate, and configured to receive light transmitted via the first λ/4 plate;

a first reflection surface at a boundary between the first and second λ/4 plates; and a second reflection surface at a surface of the second λ/4 plate on an opposite side of a surface of the second λ/4 plate located at the boundary between the first and second λ/4 plates, wherein a reflection occurs between the first and second reflection surfaces, a light transmitted via the first semi-transparent mirror being incident to the etalon, a light output from a light incident side of the etalon being fed back to said laser medium, and said laser medium outputting an output light of the external resonance type laser via the second semi-transparent mirror.

10. An external resonance type laser, comprising:

a laser medium having first and second semi-transparent mirrors; and an etalon comprising:

an element selected from a group consisting of an analyzer, a polarization splitting layer and a polarization splitting prism, configured to receive light, a first λ/4 plate, having an optical axis forming a 45 degree angle with respect to an optical axis of the element, and receiving a light transmitted via the element;

a second λ/4 plate, having an optical axis which is parallel to or 90 degrees to the optical axis of the first λ/4 plate and configured to receive light transmitted via the first λ/4 plate;

a first reflection surface formed at a boundary between the first and second λ/4 plates; and a second reflection surface formed at a surface of the second λ/4 plate on an opposite side of a surface of the second λ/4 plate located at the boundary between the first and second λ/4 plates, wherein a reflection occurs between the first and second reflection surfaces, and said element receives, as an incident light to the etalon, a linearly polarized light parallel to the optical axis of the element, a light transmitted via the first semi-transparent mirror being incident to the etalon, a light output from a light incident side of the etalon being fed back to said laser medium, and said laser medium outputting an output light of the external resonance type laser via the second semi-transparent mirror.

* * * * *

UNITED STATES PATENT AND TRADEMARK OFFICE
CERTIFICATE OF CORRECTION

PATENT NO. : 6,870,872 B2
DATED : March 22, 2005
INVENTOR(S) : Kazuaki Akimoto

It is certified that error appears in the above-identified patent and that said Letters Patent is hereby corrected as shown below:

Column 13,
Line 49, change "receiving a" to -- configured to receive --.

Column 14,
Line 62, change "receiving a" to -- configured to receive --.

Signed and Sealed this

Eleventh Day of October, 2005

JON W. DUDAS
*Director of the United States Patent and Trademark Office*